(12) United States Patent
Meiser et al.

(10) Patent No.: US 9,882,555 B2
(45) Date of Patent: Jan. 30, 2018

(54) SWITCH DEVICE

(71) Applicant: Infineon Technologies AG, Neubiberg (DE)

(72) Inventors: Andreas Meiser, Sauerlach (DE); Anton Mauder, Kolbermoor (DE); Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/192,523

(22) Filed: Jun. 24, 2016

(65) Prior Publication Data
US 2017/0373678 A1    Dec. 28, 2017

(51) Int. Cl.
*H03K 17/06* (2006.01)

(52) U.S. Cl.
CPC .................................. *H03K 17/063* (2013.01)

(58) Field of Classification Search
CPC .................................................... H03K 17/063
USPC ........ 327/383, 50, 108–112; 326/82, 83, 87, 326/427, 434, 437
See application file for complete search history.

(56) References Cited

U.S. PATENT DOCUMENTS

| | | | |
|---|---|---|---|
| 7,248,084 B2 | 7/2007 | Huang et al. | |
| 2004/0135201 A1 | 7/2004 | Elbanhawy | |
| 2009/0058498 A1 | 3/2009 | Udrea et al. | |
| 2012/0169377 A1* | 7/2012 | Thiele ................ | G01R 19/0092 327/50 |

OTHER PUBLICATIONS

Office Action from U.S. Appl. No. 15/192,473, dated Dec. 30, 2016, 7 pp.
Response to Office Action dated Dec. 30, 2016, from U.S. Appl. No. 15/192,473, filed Mar. 22, 2017, 8 pp.
U.S. Appl. No. 15/192,473, by Andreas Meiser, filed Jun. 24, 2016.
English Translation of Counterpart German Application 102015113494.2, by Infineon Technologies, filed on Aug. 14, 2015.
U.S. Appl. No. 15/056,392, filed Feb. 29, 2016.
U.S. Appl. No. 15/060,790, filed Mar. 4, 2016.
Notice of Allowance from U.S. Appl. No. 15/192,473, dated Aug. 4, 2017, 7 pp.
U.S. Appl. No. 15/678,669, by Michael Asam, filed Aug. 16, 2017.
Office Action from U.S. Appl. No. 15/192,473, dated Apr. 28, 2017, 8 pp.
Response to Office Action dated Apr. 28, 2017, from U.S. Appl. No. 15/192,473, filed Jul. 24, 2017, 7 pp.

* cited by examiner

*Primary Examiner* — Thomas Skibinski
(74) *Attorney, Agent, or Firm* — Shumaker & Sieffert, P.A.

(57) ABSTRACT

A switch is provided having a switch transistor as well as a monitoring component to monitor a control signal applied to the switch transistor. With the monitoring component, in some implementation a monitoring of the control signal independent from a load path may be possible.

19 Claims, 6 Drawing Sheets

SWITCH DEVICE

TECHNICAL FIELD

The present application relates to switch devices and corresponding methods.

BACKGROUND

Switches are used in electrical applications to selectively provide an electrical connection between two or more terminals of a respective switch. Power switches are used in applications where high voltages have to be switched and/or high currents have to be conducted via the switch, for example voltages of hundred Volts or more and currents of several Amperes, for example several tens of Amperes. Such switches may inter alia be used in safety-critical environments, for example in automotive applications. In such environments, besides the "pure" function of a device like a switch (that is selectively providing an electrical connection), functional safety aspects become more and more important, for example in automotive applications in the power transmission chain, braking, engine management etc.

For example, according to some functional safety requirements, for a specific function there may have to be alternative ways to achieve this function, and/or a safe switch-off path to deactivate the function. In some cases, in order to achieve this, redundancy may be provided, for example alternative connections between devices, or different ways to achieve a function may be provided, which is an example for diversification (sometimes also referred to as diversity). To give an example, in conventional systems to control a switch or combination of switches (for example arranged in a half-bridged topology), in some applications two signal paths are required: one to define a switching behavior of a switch (for example by providing a pulse width modulated (PWM) signal), and another one to enable/disable the operation of the switch or combination of switches. These two signals are generated and provided by different paths. However, in conventional approaches the signal paths are merged before a single control signal is provided to the switch. When a signal path used to transmit the single control signal is broken, the switch may enter an undesired or undefined state or may otherwise exhibit an erroneous behavior. In safety-critical environments, it is often desirable to be able to at least detect such an erroneous state.

SUMMARY

According to an implementation, a switch device is provided, comprising:
a switch transistor including a control terminal, a first load terminal and a second load terminal, and a monitoring component configured to monitor a signal at the control terminal of the switch transistor.

According to another implementation, a method is provided, comprising:
applying a test control signal to a switch, the switch comprising a switch transistor including a control terminal and first and second load terminals, and
evaluating the test control signal in the switch independent from a load path comprising the first and second load terminals.

According to yet another implementation, a switch device is provided, comprising:
a switch transistor,
a monitoring transistor,
wherein a control terminal of the monitoring transistor is coupled to a control terminal of the switch transistor,
wherein a first load terminal of the switch transistor is to be coupled to load,
wherein a first load terminal of the monitoring transistor is coupled to a monitor circuit, and
wherein a second load terminal of the switch transistor is coupled to a second terminal of the monitoring transistor.

The above summary is only intended to provide a brief overview over some implementations and is not to be construed as limiting.

Figure 1:
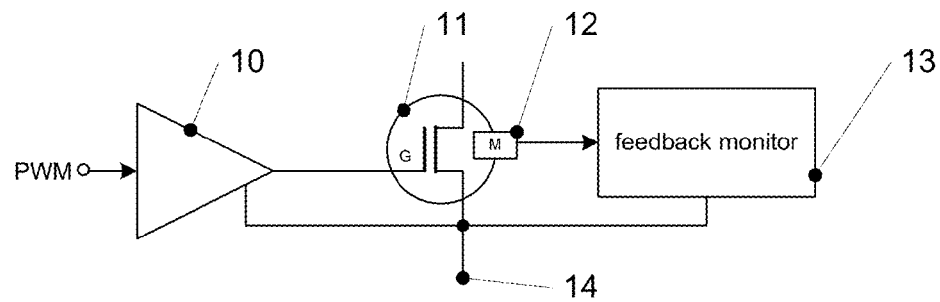
FIG. 1 is a schematic circuit diagram of a switch device according to an embodiment.

In the following, various embodiments will be described referring to the attached drawings. These embodiments serve as examples only and are not to be construed as limiting. For example, while embodiments may be described comprising a plurality of features or elements, in other embodiments some of these features or elements may be omitted and/or may be replaced by alternative features or elements. Furthermore, in addition to the features or elements explicitly shown in the drawings and described herein further features or elements, for example features or elements employed in conventional switch devices, may be provided.

Features or elements from different embodiments may be combined with each other to form further embodiments. Variations or modifications described with respect to one of the embodiments may also be applicable to other embodiments.

In the embodiments described and shown, any direct electrical connection between components, i.e. any electrical connection without intervening elements (for example simple metal layers or wires) may also be replaced by an indirect connection or coupling, i.e. connection or coupling with one or more additional intervening elements, and vice versa, as long as the general purpose and function of the connection, for example to transmit a certain kind of signal or information or to provide a certain kind of control, is essentially maintained.

Some embodiments use transistors as switch devices. Transistors are generally described as comprising a control terminal, a first load terminal and a second load terminal. The control terminal may for example be a gate terminal in case of a field effect transistor (FET) like a MOSFET or an insulated gate bipolar transistor (IGBT), or may be a base terminal in case of a bipolar transistor. The first and second load terminals may for example be source and drain terminals in case of field effect transistors or may be collector and emitter terminals in case of IGBTs or bipolar transistors. Depending on a signal at the control terminal, the transistor is conducting or non-conducting between the first and second load terminals. The conducting state is also referred to as on-state or closed state of the transistor or switch, whereas the non-conducting state is also referred to as an off-state or open state. A signal level of a control signal applied to the control terminal causing the on-state is referred to as active signal level, and a signal level causing the off-state is referred to as an inactive signal level of the control signal. The signal levels depend on the implementation of the transistor, for example n-channel or p-channel transistor, p-n-p or n-p-n bipolar transistor etc.

Some embodiments use dual gate transistors as switch devices. Dual gate transistors are transistors comprising a first load terminal and a second load terminal as explained above as well as a first gate terminal and a second gate terminal as control terminals. In some implementations of dual gate transistors, only if a signal having an active signal level is applied to both first and second gate terminals, the transistor is in an on-state. When to none of the first and second gate terminals or only one of the first and second gate terminals a signal having an active signal level is applied, the transistor is an off-state.

"Non-conducting" in this context means non-conducting apart from possible small leakage currents, which may occur depending on the transistor implementation.

Some embodiments use switches having an integrated monitoring component, circuit or element (referred to simply as monitoring component hereinafter) which enables a monitoring of the control signal and effect thereof on switching independent or essentially independent of a load path, i.e. independent from current flowing between the first and second load terminals or not. In this way, correct functioning of the control signal like a gate signal may be tested without necessarily having to provide a current flow via the load terminals. This is in contrast for example to conventional current monitoring in switch transistors, which requires a load current to flow via the first and second load terminals.

Next, specific embodiments will be described referring to the Figures. In these embodiments, gate terminals are used as examples for control terminals, which is not to be construed as limiting.

FIG. 1 shows a schematic circuit diagram of a switch device according to an embodiment. The switch device of FIG. 1 is implemented using a transistor 11. A gate terminal of transistor 11 (labelled G in FIG. 1) is controlled by a gate driver 10. Gate driver 10 may for example be supplied with a pulse width modulated (PWM) signal PWM to selectively turn switch 11 on and off.

Furthermore, transistor 11 comprises a monitoring component 12 which in some embodiments may be located on a same chip die as transistor 11 and/or may implemented using common implementation technology with transistor 11. Monitoring component 12 evaluates the signal output by gate driver 10 to gate G and outputs a signal to a feedback monitor 13. In this way, in some embodiments, it may for example be evaluated if the signal output by gate driver 10 is present at the gate terminal and/or has appropriate voltage levels to open and close transistor 11.

In the embodiment of FIG. 1, gate driver 10, transistor 11 and feedback monitor 13 are all coupled to a common reference potential or supply voltage 14, which in implementations may be ground or a negative supply voltage. In such cases, transistor 11 may for example act as a low side switch to selectively couple a load to ground. In other embodiments, gate driver 10, switch transistor 11 and/or feedback monitor 13 may be coupled to different reference potentials.

Monitoring component 12 of FIG. 1 may be implemented in different ways. For example, monitoring component 12 may share a gate structure and load terminal with switch transistor 11. In other embodiments, the gate potential at switch transistor 11 may be fed back via a separate path. In other embodiments, a capacitive coupling of the load path between the load terminals of switch transistor 11 to an additional electrode may be used. In yet other embodiments, a potential at the switch transistor, which is connected to a load, may be fed back to feedback monitor 13, and a change of this potential during operation of the switch may be evaluated. For example, in FIG. 1 a potential of the drain terminal of transistor 11 may be measured, and/or a low current may be fed into the load path (i.e. the path between the load terminals of switch transistor 11) using a separate voltage source which may provide for example a lower voltage than a regular voltage supply. More detailed examples for monitoring components will be discussed with reference to FIGS. 2, 4 and 5 below.

Figure 2:
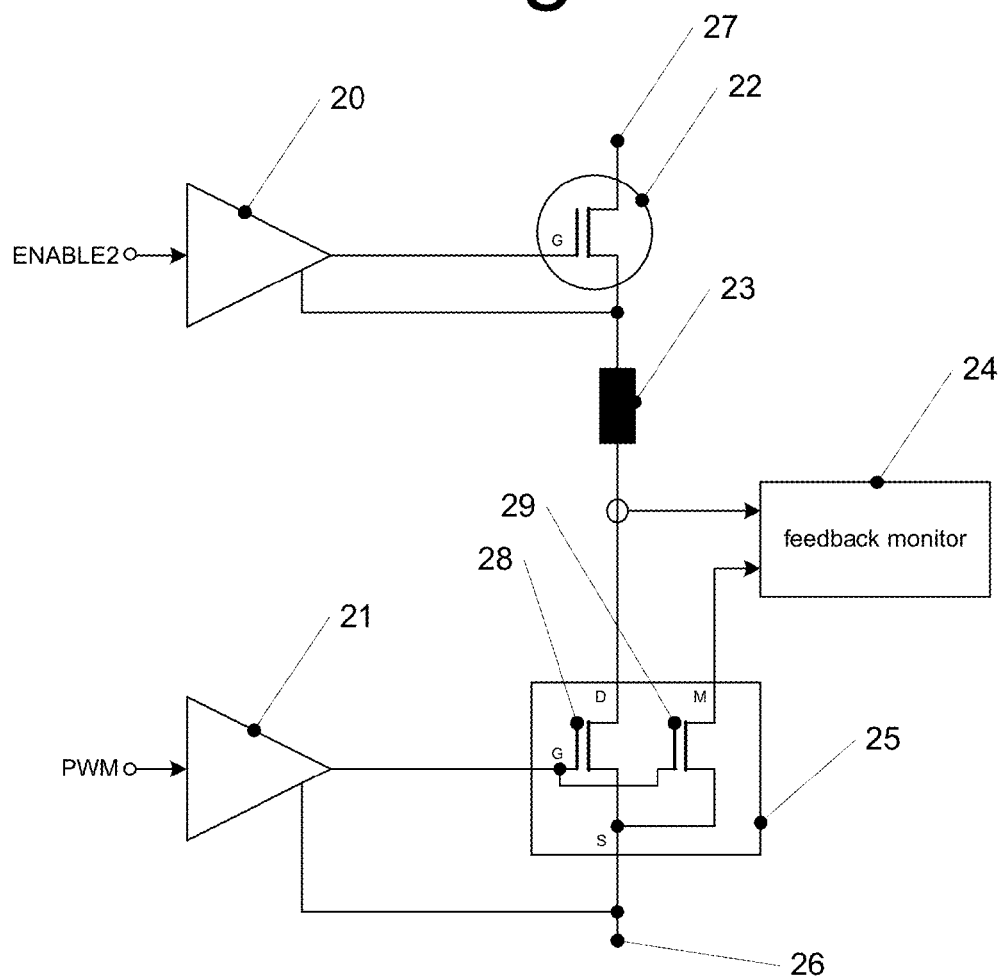
FIG. 2 is a circuit diagram of a switch device according to an embodiment.

FIG. 2 illustrates a switch device according to an embodiment. The switch device of FIG. 2 comprises a first switch 22 implemented as a switch transistor and coupled between a positive supply voltage 27 and a load 23. First switch 22 therefore acts as a high side switch in the switch device of FIG. 2. A gate terminal G of first switch 22 is driven by a gate driver 20 controlled by an enable signal ENABLE2. Using the enable signal ENABLE2, windows where current may flow via load 23 may be defined. In other words, current may only flow via load 23 when first switch 22 is closed.

Furthermore, FIG. 2 comprises a second switch 25 comprising an example for a monitoring component like monitoring component 12 of FIG. 1. In the example of FIG. 1, second switch 25 is coupled between load 23 and a negative supply voltage or ground 26 and therefore acts as a low side switch.

Second switch 25 comprises a first transistor 28 acting as switch transistor and a second transistor 29 acting as monitoring transistor. Source terminals of transistors 28, 29 are commonly coupled to ground 26. This configuration of transistors 28, 29 may also be referred to as a common source configuration. Gate terminals G of transistors 28, 29 are coupled to each other and commonly driven by a gate driver 21. Gate driver 21 may be controlled by pulse width modulated signal PWM to control switching of second switch 25. Such switching may lead to current flow via load 23 if happening at the same time as first switch 22 being closed based on enable signal ENABLE2.

A drain terminal D of first transistor 28 is coupled to load 23 to provide selective coupling of load 23 to ground 26. A drain terminal of second transistor 29 is coupled to a feedback monitor 24 to serve as monitoring output M. By evaluating signals received from monitoring output M, feedback monitor 24 may evaluate and monitor functioning of the gate signal supplied by gate driver 21.

First transistor 28 and second transistor 29 in embodiments may share a same gate structure. Therefore, the switching behavior of first transistor 28 is the same as the switching behavior of second transistor 29 (i.e. a signal output by gate driver 21 switching first transistor 28 on also switches second transistor 29 on, and a signal switching first transistor 28 off also switches second transistor 29 off).

It should be noted that the monitoring by transistor 29 is independent from current flowing via load 23 and therefore independent from a load path. This is different from conventional current monitoring transistors used in switches which are coupled to a main switch transistor in a current mirror configuration. In second switch 25, second transistor 29 is not in a current mirror configuration to first switch 28. Furthermore, the gate control signal output by gate driver 21 may be monitored by second transistor 29 also in a state where first switch 22 is open and therefore no current may flow via load 23. Therefore, the monitoring may take place during times where no current flows, for example at startup of a system incorporating the switch device.

By observing the state of a signal received from monitoring output M, feedback monitor 24 may detect whether the connections of second switch 25 to gate driver 21 are correct and the gate voltage levels are sufficient to activate the switch. Sharing a same gate structure makes the monitoring output (i.e. drain terminal of second transistor 29) independent from changes of an activation threshold of the switch for example due to temperature or process variations.

Furthermore, in some embodiments feedback monitor 24 may receive a signal from a load path, for example path between load 23 and second switch 25 as shown, for example to evaluate a current flow.

In the embodiment of FIG. 2, second switch 25 is controlled based on a pulse width modulated signal PWM. In other embodiments, second switch 25 (or also first switch 22) each may be controlled by other kinds of control signals, or by more than one signal. An example is shown in FIG. 3.

Figure 3:
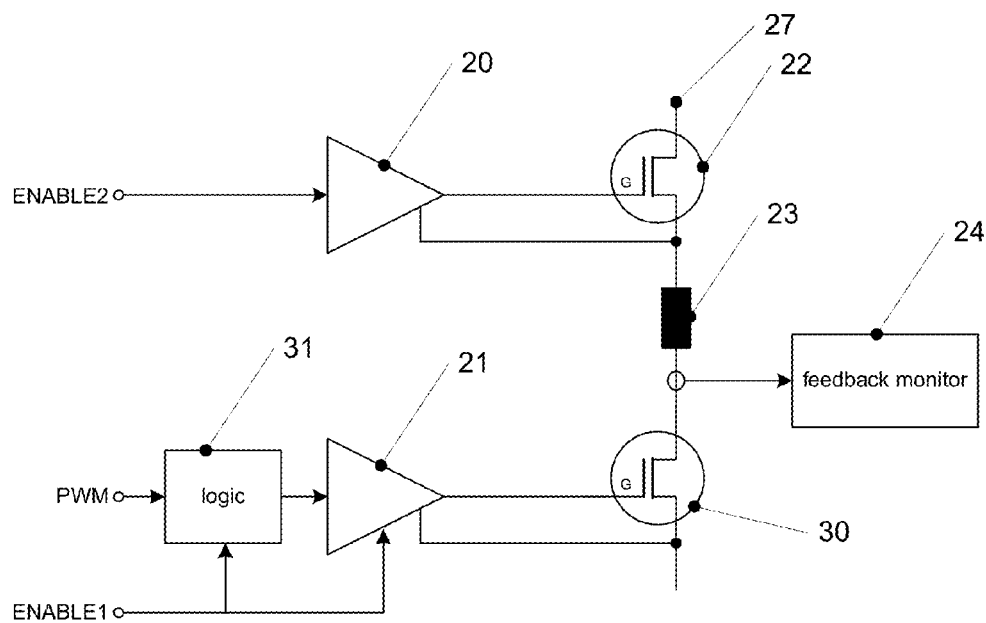
FIG. 3 is a circuit diagram of a switch device illustrating additional features usable in some embodiments.

In FIG. 3 in order to avoided repetitions components already discussed with reference to FIG. 2 bear the same reference numeral and will not be discussed again in detail.

In particular, also the switch device of FIG. 3 comprises a first switch 22 driven by a gate driver 20. Furthermore, the switch device of FIG. 3 comprises a second switch 30, which may for example be implemented as shown for second switch 25 of FIG. 2 or for the switch of FIG. 11 having monitoring component 12. Switch 30 is driven by gate driver 21, similar to switch 25 of FIG. 2. Gate driver 21 is driven via a logic circuit 31 based on a PWM signal PWM which defines a switching. In addition to FIG. 2, a further enable signal ENABLE1 is provided which selectively activates or deactivates one or both of logic circuit 31 and gate driver 21. Enable signal ENABLE1 may define an operation window for switch 30, and the signal PWM may define individual switching events during the operation window for switch 30.

While in FIGS. 2 and 3 a low side switch has been discussed as comprising a monitoring component to monitor a gate signal, in other embodiments also a high side switch like first switch 22 of FIGS. 2 and 3 may be provided with such a monitoring component.

The embodiments discussed so far use switches having a single gate. In other embodiments, dual gate transistors may be used as switch transistors. Examples will now be discussed with reference to FIGS. 4 and 5.

Figure 4:
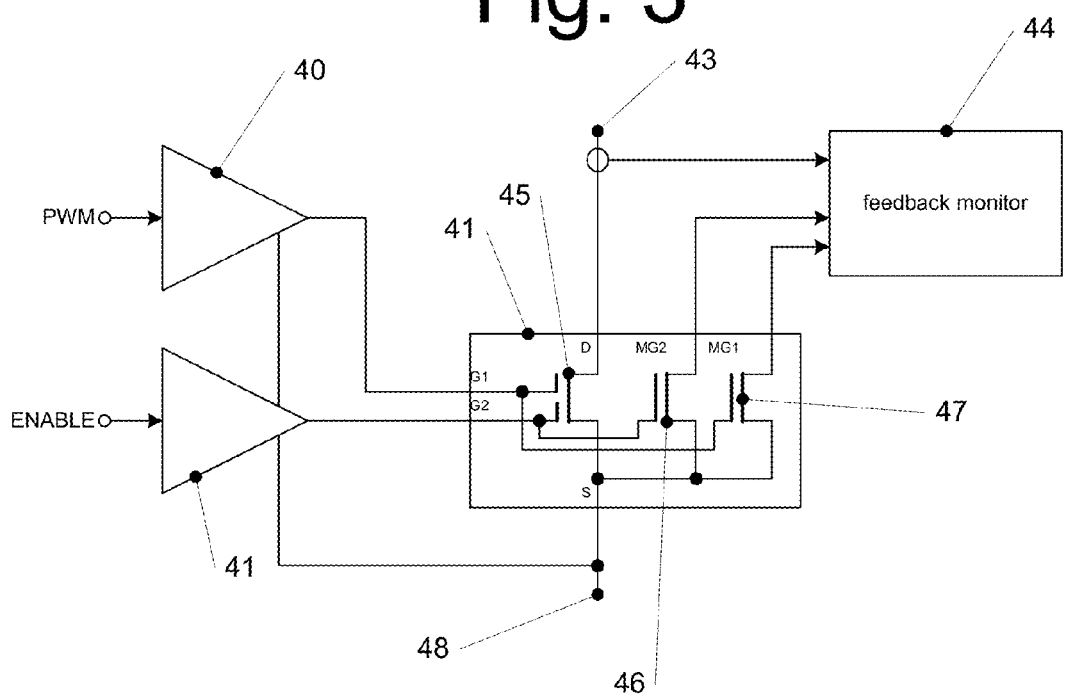
FIG. 4 is a circuit diagram of a switch device according to an embodiment.

FIG. 4 illustrates a switch device comprising a switch 41. Switch 41 may for example be used as low side switch, for example in the switch devices of FIGS. 2 and 3 replacing second switches 25 and 30, respectively. Similar switches may also be used as high side switches.

Switch 41 comprises a first transistor 45 as switch transistor. First transistor 45 is implemented as a dual gate transistor having a first gate G1 and a second gate G2.

First gate G1 is controlled by first gate driver 40, and second gate G2 is controlled by second gate driver 41. First gate driver 40 is provided with a pulse width modulated signal PWM to control individual switching of first transistor 45, and second gate driver 41 is provided with an enable ENABLE to define operation windows for switching of first transistor 45. In case of a low side switch, a source terminal of second transistor 45 may be coupled with a negative supply voltage or ground at 48 and coupled to a load 43.

Furthermore, switch 41 comprises a second transistor 46 and a third transistor 47 acting as monitoring transistors. Second transistor 46 in the embodiment of FIG. 4 has a gate coupled with second gate G2 of first transistor 45, and third transistor 47 has a gate coupled to first gate G1 of first transistor 45. The gate coupling, respectively, may be implemented using common gate structures. Source terminals of transistors 45 to 47 are coupled with each other in a common source configuration, similar to the common source configuration of transistors 28, 29 of FIG. 2.

A drain output of second transistor 46 serves as monitoring output MG2 for the second gate G2 of transistor 45, and a drain terminal of third transistor 47 serves as monitoring output MG1 for monitoring first gate G1 of transistor 45. Monitoring outputs MG1, MG2 are fed to a feedback monitor 44, which may use a signal received from monitoring outputs MG1, MG2 to monitor a signal at gates G1, G2 in a same manner as described for the embodiment of FIG. 2 for monitoring output M of transistor 29. In this way, in switch 41 gates G1, G2 may be monitored independently. It should be noted that in other embodiments only one of the gates may be monitored, and the respective other transistor 47, 46 may be omitted. Feedback monitor 44 in addition may receive a signal from terminal 43 as shown to monitor a load current, as also explained for feedback monitor 24 of FIG. 2.

Feedback monitor 24 may for example be implemented as a logic circuit or implemented using a programmable microprocessor, an application specific integrated circuit or other suitable components.

Figure 5:
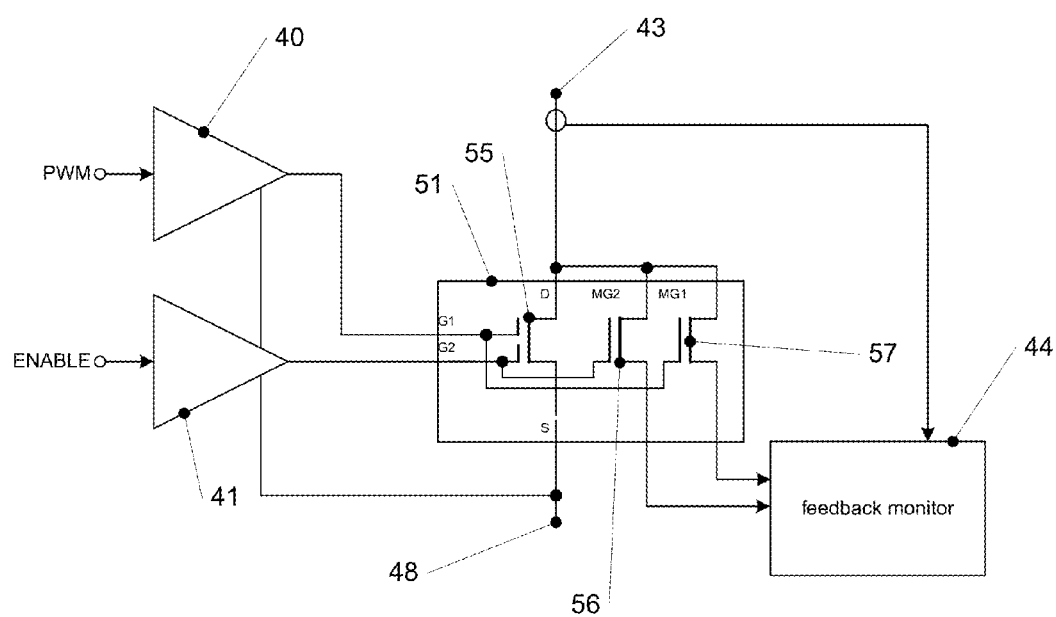
FIG. 5 is a circuit diagram illustrating a switch device according to an embodiment.

While with respect to FIGS. 2 and 4 common source configurations have been discussed, other configurations are also possible. As an example, FIG. 5 illustrates a common drain configuration. Common drain transistors are widely available among power switches like power MOSFETs. In such implementations, the drain is on the rear side of a respective chip and connected to a chip carrier or lead frame, while gate and source or multiple source regions may be located on the front side of corresponding chips. Vertical IGBTs with their collector electrode located also on the rear side of the chip may be regarded as common collector devices and may be used to implement switch devices according to an embodiment similar to common drain devices. Therefore, such common drain structures may be used to implement a switch transistor and one or more monitoring transistors.

The embodiment of FIG. 5 is similar to the embodiment of FIG. 4, and like elements comprised therein are designated with the same reference numerals to avoid repetitions. Instead of switch 41 of FIG. 4, a switch 55 is provided. Switch 55 comprises a first transistor 55 as switching transistor and second and third transistors 56, 57 as monitoring transistors, similar to what was described for transistors 45 to 47 of FIG. 4. In contrast to FIG. 4, drain terminals of transistors 55 to 57 are coupled together, and source terminals of transistors 56, 57 serve as monitoring outputs MG2, MG1, respectively, coupled to feedback monitor 44. Monitoring transistors 56, 57 of FIG. 5 may require a smaller chip area than first transistor 55 used for switching. The same may apply to transistors 46, 47 of FIG. 4 compared with transistor 45.

While the structures of FIG. 5 are somewhat similar to conventional current mirrors, they are not designed to provide an exact mirror current, but merely to sense whether there is a current or not or whether a current is within certain course limits.

In the switch device of FIG. 5, voltages at source terminals of transistors 56, 57 are automatically limited to the voltage supply to the gates by the gate drivers 40, 41 minus the threshold voltage of the respective transistors. Therefore, in FIG. 5 the inputs of feedback monitor 44 to receive signals from transistors 56, 57 need not be configured as high voltage inputs independently from a maximum voltage which may be applied to drain terminals of the switches.

In embodiments, the transistors discussed above may be formed by a plurality of transistor cells, as commonly done for power transistors. For the respective first transistor (45 or 55) used for switching, more such transistor cells may be used than for the respective second and third transistors (for example 46, 47, 56, 57) used for monitoring. Feedback monitor 44 may for example measure a small monitor current when the transistors are turned on.

Next, with reference to FIGS. 6 to 8 example implementations of transistors usable in the embodiments discussed above as switches or switch devices will be discussed.

FIG. 6A illustrates a cross-sectional view of a dual gate transistor according to an embodiment, and FIG. 6B illustrates a horizontal cut through the structure of FIG. 6B close to the silicon surface, as indicated by reference points I and I' visible in both Figures. In the dual gate transistor of FIGS. 6A and 6B, a source down configuration may be used where a deep metal contact on the source side feeds in current from a backside of the semiconductor body to two serial ordered gate trenches in a common bulk region. Both channel regions are connected to each other with an additional deep n+/metal contact plug. A high voltage drift zone is realized with separate field plate trenches compensating drift zone doping. A shallower drain contact metal plug is collecting the current and conducts it towards a front side of the semiconductor body.

FIGS. 6A and 6B show a dual gate transistor. The terms "lateral" and "horizontal" as used for describing dual gate transistor structures intend to describe an orientation parallel to a first surface of a semiconductor substrate or semiconductor body. This can be for instance the surface of a wafer or a die.

The term "vertical" intends to describe an orientation which is arranged perpendicular to the first surface of the semiconductor substrate or semiconductor body.

The terms "wafer", "substrate", "semiconductor substrate" or "semiconductor body" used in the following may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The transistor of FIGS. 6A and 6B comprises a source region 201 and a drain region 205. The transistor further comprises a first gate electrode 210 and a second gate electrode 213. The first gate electrode 210 is disconnected from the second gate electrode 213, i.e. the first gate electrode and the second gate electrode are separated from each other and are not connected to a common terminal. The transistor 200 further comprises a body region 220. The first gate electrode 210 is disposed adjacent to a first portion 221 of the body region 220 and the second gate electrode 213 is adjacent to a second portion 222 of the body region 220.

The transistor further comprises first trenches 212, the first trenches patterning the first portion 221 of the body region 220 into a first ridge. The transistor further comprises second trenches 215, the second trenches 215 patterning the second portion 222 of the body region 220 into a second ridge. The first gate electrode 210 is arranged in at least one of the first trenches 212 and the second gate electrode 213 is arranged in at least one of the second trenches 215. The first and the second trenches 212, 215 are indicated by broken lines in FIG. 6A. In more detail, they are disposed before and behind the depicted plane of the drawing. The first trenches 212 and the second trenches 215 pattern the first portion 221 of the body region into first ridges and pattern the second portions 222 of the body region 220 into second ridges.

Elements of field effect transistors are described herein. Generally, a field effect transistor comprises a plurality of transistor cells that are connected in parallel. For example, as will be discussed in the present specification, each single transistor cell comprises a first gate electrode, a second gate electrode, a body region and further components. The first gate electrodes of the single transistor cells may be connected to a common terminal, e.g. a first gate terminal. The second gate electrodes of the single transistor cells may be connected to a common terminal, e.g. a second gate terminal. Further components of the single transistor cells, e.g. source regions, drain regions may be respectively connected to a common source terminal, a common drain terminal etc. The following description specifically describes the structure of the single transistor cells while generally referring to a transistor. However, as is to be clearly understood the single transistor cells are connected with a plurality of further transistor cells so as to form the respective transistor. Some of the components of the transistor cells such as the body regions may be formed separately from each other. Other components of the transistor cells such as the drain regions may be formed jointly for all of the transistor cells connected in parallel.

The source region 201 and the drain region 205 may be of the first conductivity type, e.g. n-type, and the body region 220 may be of the second conductivity type, e.g. p-type.

The source region 201 is disposed adjacent to a first main surface of a semiconductor substrate 100. For example, the source region 201 may extend into the semiconductor substrate 100, for example to a bottom side of the first trench 212. The source region 201 may be electrically connected to a source terminal 204 via a source contact 202. According to an embodiment, the source contact 202 may be electrically connected to the first portion 221 of the body region 220 and to the body region 220 by means of a horizontal body contact portion 226. The horizontal body contact portion 226 may be disposed at a bottom side of the source contact 202.

The source region 201 and the drain region 205 are disposed along a first direction, e.g. the x-direction parallel to a horizontal surface of the semiconductor substrate 100. The first and second trenches 212, 215 may have a longitudinal axis that extends in the first direction.

The semiconductor device may further comprise a connection portion 216 that electrically connects the first portion 221 of the body region with the second portion 222 of the body region. For example, as is illustrated in FIG. 1A, the connection portion may be implemented by a connection groove having sidewalls which are doped with dopants of the first conductivity type to form a doped region 218 and may be filled with a conductive filling 217.

The first gate electrode 210 may be insulated from the first portion 221 of the body region by means of a first gate dielectric layer 211. Further, the second gate electrode 213 may be electrically insulated from the second portion 222 of the body region by means of a second gate dielectric layer 214. The first gate electrode 210 may be connected to a first gate terminal 231, and the second gate electrode 213 may be electrically connected to a second gate terminal 232. According to an interpretation, the second gate electrode 213 and the adjacent second portion 222 of the body region may be understood to implement a drift region which is controlled by a second gate electrode 213.

The transistor of FIGS. 6A and 6B further comprises a drift zone 260 disposed between the second portion 222 of the body region 220 and the drain region 205. For example, the drift zone 260 may be of the first conductivity type, e.g. at a lower doping concentration than the source region 201 or the drain region 205. Due to the presence of the drift zone 260 even at high voltages between source region and drain region a breakdown may be prevented.

FIG. 6A shows a horizontal cross-sectional view. As is shown, the drift zone 260 is disposed as a region extending along the second direction, e.g. the y direction. The drift zone 260 is disposed between the body region 220 and the drain region 205.

According to the embodiment illustrated in FIGS. 6A and 6B, the semiconductor substrate 100 may comprise a base layer which may be of the second conductivity type, e.g. p-type. A second semiconductor layer 150 of the first conductivity type, e.g. n-type may be formed over the base layer. A buried layer of the first conductivity type which is doped at a higher doping concentration than the second semiconductor layer 150 may be disposed between the base layer and the second semiconductor layer 150. A doped layer 160 which may e.g. be of the second conductivity type is formed over the second semiconductor layer 150. The buried layer provides an electrical insulation of the components of the transistor 200 from the base layer. The body region 220 may be defined by the doped layer 160.

According to any embodiments, the doping concentration in the various semiconductor layers may have a gradient. For example, the doping concentration may vary at different portions depending on the requirements of the semiconductor device.

The transistor according to the embodiment shown in FIGS. 6A and 6B furthermore comprises a field plate 250 which may be disposed adjacent to the drift zone 260. The field plate 250 may be insulated from the drift zone 260 by means of a field dielectric layer 251. The field plate 250 may be connected to a suitable terminal. For example, as is illustrated in FIG. 6A, the field plate 250 may be electrically connected to the source terminal 204. When the transistor is switched off, the field plate may deplete charge carriers from the drift zone so that the breakdown voltage characteristics of the semiconductor device are improved. In a semiconductor device comprising a field plate, the doping concentration of the drift zone may be increased without deteriorating the breakdown voltage characteristics in comparison to a device without a field plate. For example, the doping concentration may be increased in a portion adjacent to the field plate. Further, a region below this portion may be doped at a lower doping concentration in order to provide the desired breakdown voltage characteristics. Due to the higher doping concentration of the drift zone, the on-resistance Ron.A is further decreased resulting in improved device characteristics.

The field plate 250 may be implemented as a planar field plate which is disposed entirely over the semiconductor substrate 100. According to a further embodiment, the field plate 250 may be disposed in field plate trenches 252 that pattern the drift zone 260 into a third ridge. For example, as is shown in FIG. 6A, the field plate trenches 252 may be disposed before and behind the depicted plane of the drawing. For example, the field plate trenches 252 may extend to a deeper depth than the first and second gate trenches 212, 215. Further, as is shown in FIG. 6A, the depth t2 may larger than the depth t1 of the gate trenches. For example, etching the gate trenches 212, 215 may be performed simultaneously with etching the field plate trenches 252. Due to the larger width of the field plate trenches 252 the field plate trenches may be etched to a larger depth. For example, a bottom side of the field plate trench 252 may be below the bottom side of the body region 220.

FIG. 6B as mentioned shows a horizontal cross-sectional view of the transistor. As is shown, field plate trenches 252 are disposed in the drift zone 260. For example, field plate trenches 252 may have larger width measured along the second direction than the gate trenches 212, 215. Further, a distance between adjacent field plate trenches 252 may be larger than a distance between adjacent first gate trenches 212 or adjacent second gate trenches 215.

Figure 6:
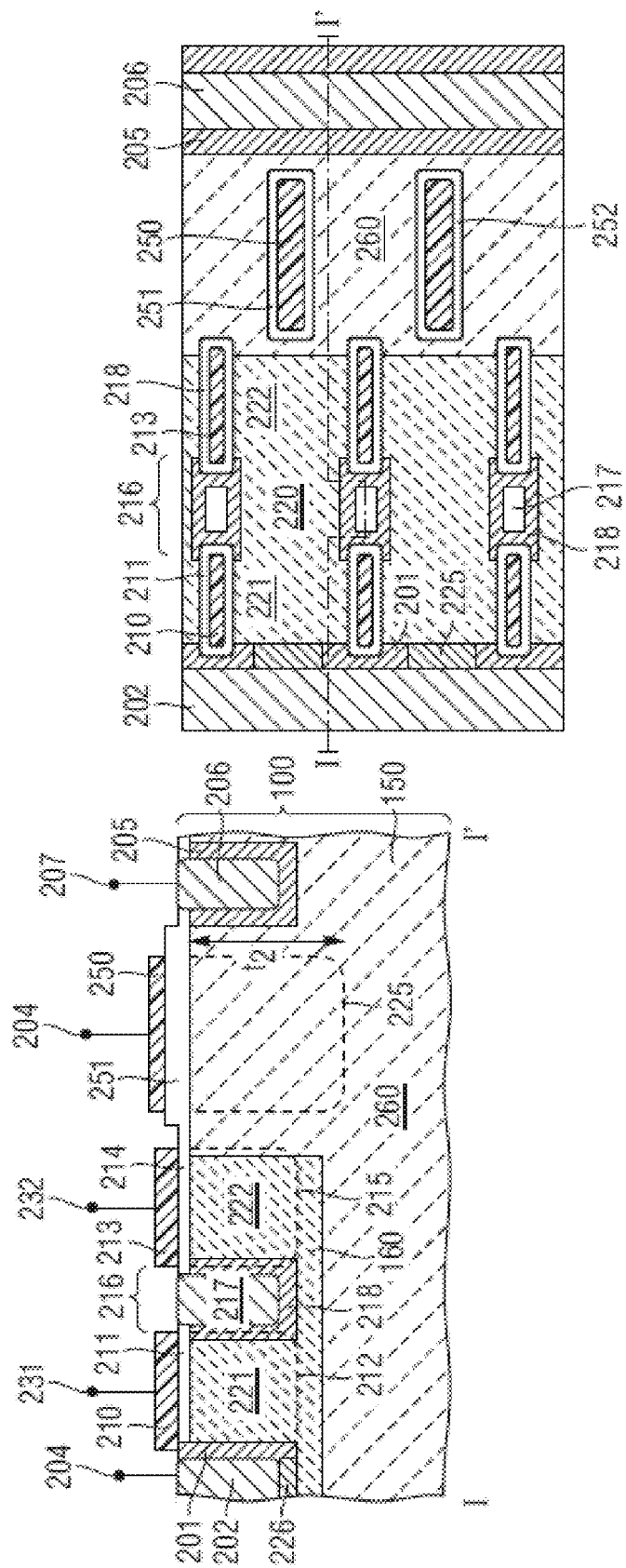
FIGS. 6A and 6B illustrate an implementation example of a dual gate transistor usable in embodiments.
Figure 7:
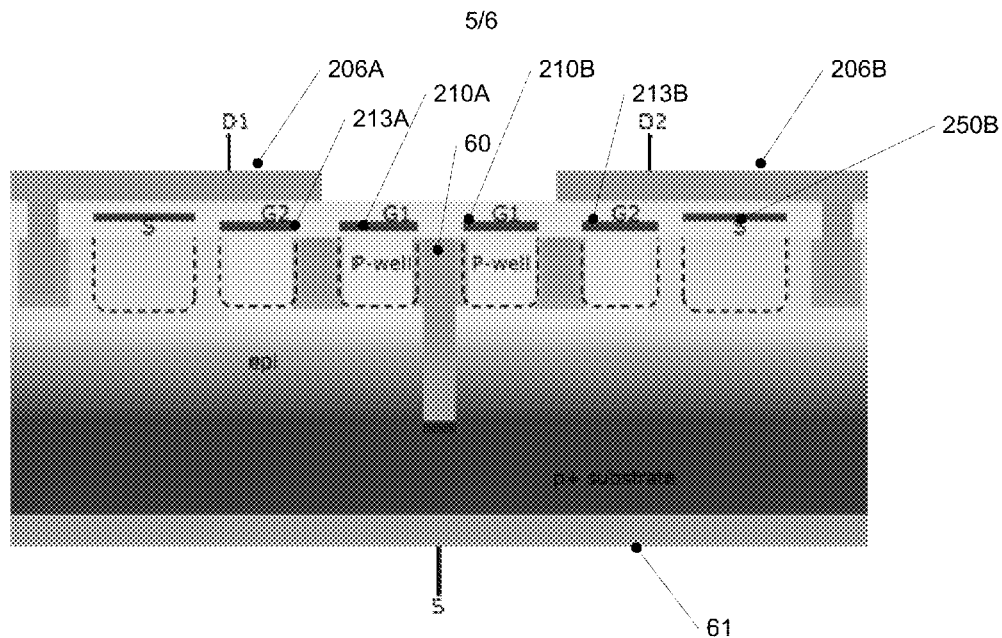
FIG. 7 illustrates a cross-sectional view of a dual gate transistor structure according to an embodiment.

FIG. 7 essentially illustrates a cross-sectional view with two dual gate transistors having separate drain regions (206A, 206B), but a common source terminal 61. The structure of FIG. 7 is essentially a symmetrically mirrored version of the structure of FIG. 6A, and corresponding elements are labelled with the same reference numerals (with additions of A and B to distinguish elements of the two transistors) separated by a trench material 60. Therefore, the elements will not be described again in detail. By providing two transistors with separate drains but common source, for example a current sensing may be performed, usable for example for feedback monitoring as by component 46 of FIG. 4

Figures 8A, 8B:
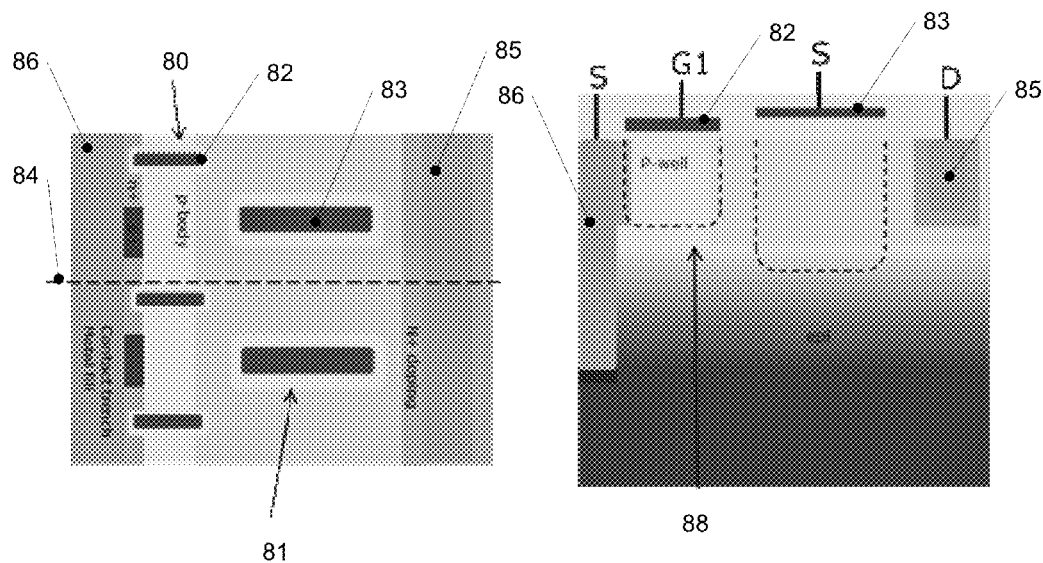
FIGS. 8A and 8B illustrate an implementation example of a single gate transistor usable in embodiments.

With reference to FIGS. 6 and 7 dual gate configurations usable for example in the embodiments of FIGS. 4 and 5 have been described. FIGS. 8A and 8B illustrate an implementation example of a single gate transistor usable for example in the embodiment of FIG. 2. FIG. 8A illustrates a horizontal view similar to FIG. 6B, and FIG. 8B illustrates a cross-sectional view similar to FIG. 6A. Implementation of the transistor structure of FIGS. 8A and 8B is similar to the implementation structure of the transistors of FIGS. 6A and 6B with only one gate terminal G1 being provided. S denotes source terminals, and D denotes a drain terminal. Dashed lines 88 indicate trenches behind the plane of the cross-sectional view of FIG. 8B. 86 denotes a source trench, and 85 a drain trench. 80 denotes a gate trench. 82 denotes gate electrodes similar to gate electrodes 210 of FIG. 6B, 81 denotes field plate trenches and 83 corresponding field plates, similar to trenches 251 and field plates 250 of FIGS. 6A and 6B. 84 in FIG. 8A denotes a line along which the cross-section of FIG. 8B is taken.

Therefore, various transistor configurations have been described and shown which may be used to implement the switches of the embodiments previously discussed.

Figure 9:
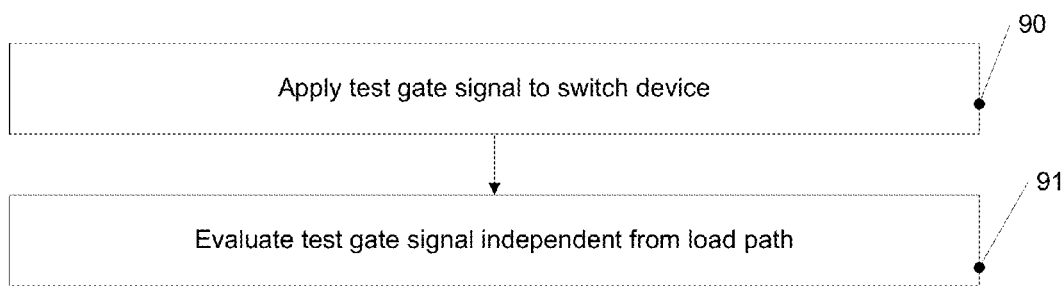
FIG. 9 is a flow chart illustrating a method according to an embodiment.

FIG. 9 is a flow chart illustrating a method according to an embodiment. With respect to FIG. 9 possible operation of the previously discussed embodiments for gate signal testing and monitoring will be discussed, and to provide a deeper understanding reference will be made to the previously discussed switch devices when discussing the method of FIG. 9. However, the method of FIG. 9 may also be applied to other switch devices. While the method of FIG. 9 will be discussed as series of acts or events, the order in which these acts or events are described is not to be construed as limiting.

Generally, to test signals at 90 in FIG. 9 the method comprises applying a test gate signal to the switch, for example by controlling a gate driver like gate driver 21 of FIG. 3, one of gate drivers 40 or 41 of FIG. 4 or 5 or gate driver 10 of FIG. 1 accordingly. At 91, the method comprises evaluating the test signal, for example using a monitoring component as discussed previously. The monitoring may be independent from a load path, so a flowing of a load current is not necessary.

If the evaluation results in a finding that no gate signal is present at the switch or the signal levels are not appropriate, a corresponding error signal may be generated.

Some variations, modifications and additions to the method described with respect to FIG. 9 are discussed.

For example, in embodiments having an additional switch like FIGS. 2 and 3, the additional switch (for example switch 22 of FIG. 2 or 3) may be open during testing, and a gate signal may be applied to switch 25 of FIG. 2 or any other switch having a monitoring component. As the additional switch like switch 22 is open, no load current flows, and a voltage at a load terminal of the switch connected to the load (for example drain terminal of transistor 28 of FIG. 2) is not clearly defined. As a result, the effect of the gate signal cannot be seen in the load path but the monitoring output may indicate a correct (or incorrect) control of the gate terminal of the switch.

In other embodiments, a further switch may be closed (for example switch 22), or no further switch may be provided and a load like load 23 may be directly connected to a positive supply voltage. In this case, when the switch to be tested (for example switch 25 of FIG. 2) is open, the full supply voltage is present at the load terminal of the switch connected to the load, for example at the drain terminal of transistor 28 of FIG. 2. In case of high voltage applications, this voltage may be difficult to directly handle by a feedback monitor circuit. Furthermore, in some applications an inductivity of the load like load 23 may be comparatively high, so it would take time to detect a variation of a current in the load path. In this case, a short activation of the switch, e.g. with a short pulse, has only a negligible influence on the mode load path, whereas functioning of the gate can be controlled by the monitoring output. Therefore, in such implementations as test gate signal at 90 at FIG. 9 a short pulse with an active signal level may be used which has negligible effect on the load path. Depending on the value of the inductance in the load path, a pulse may be considered as short if the load current changes less than a few %, e.g. less than 2% due to the pulse. Such a short pulse may only lead to a small change in the load current, but may lead to increased EMI (electromagnetic interference) and noise effects. A monitoring circuit monitoring a load current change due to a short pulse in embodiments is sensitive and may be disturbed by the short pulse. With a monitoring terminal independent from the load path through the switch, the pulse can be even much shorter (and may lead to much less than 1% of load current change) and can still be reliably detected in some embodiments.

In case a dual gate transistor is used as a switch transistor (for example transistor 45 of FIG. 4 or 55 of FIG. 5), one of the gates may be tested using the method explained with reference to FIG. 9, and the other gate terminal may be fed provided with an inactive signal level, such that no load current flows, but still a gate signal testing may be provided. In other words, during the testing only one of the signals PWM, ENABLE of FIGS. 4 and 5 have an active signal level.

According to some implementations, the following examples are provided:

EXAMPLE 1

A switch device, comprising:
a switch transistor including a control terminal, a first load terminal and a second load terminal, and
a monitoring component configured to monitor a signal at the control terminal of the switch transistor.

EXAMPLE 2

The switch device of example 1, wherein the monitoring component and the switch transistor are provided on a same chip die.

EXAMPLE 3

The switch device of any one of examples 1 or 2, wherein the monitoring component is configured to monitor the signal at the gate terminal essentially without influencing a load path including the first and second load terminals.

EXAMPLE 4

The switch device of any one of examples 1-3, wherein the monitoring component is configured to monitor the signal at the gate terminal while no current flows between the first and second load terminals.

EXAMPLE 5

The switch device of any one of examples 1-4, wherein the monitoring component comprises a further transistor, a control terminal of the further transistor being coupled to the control terminal of the switch transistor.

EXAMPLE 6

The switch device of example 5, wherein the control terminal of the further transistor and the control terminal of the switch transistor are implemented in a common gate structure.

EXAMPLE 7

The switch device of any one of examples 5 or 6, wherein the second load terminal of the switch transistor and a second load terminal of the further transistor are commonly coupled to one of a negative supply voltage or ground.

EXAMPLE 8

The switch device of any one of examples 5-7, wherein the second load terminal of the switch transistor and the second terminal of the further transistor are source terminals.

EXAMPLE 9

The switch device of any one of examples 5-8, wherein a first load terminal of the further transistor is coupled to a feedback monitoring circuit configured to evaluate a signal received from the further transistor.

EXAMPLE 10

The switch device of any one of examples 1-9, wherein the switch transistor comprises a further control terminal.

EXAMPLE 11

The switch device of example 10, further comprising a further monitoring component associated with the further control terminal, the further monitoring component being configured to monitor a further signal applied to the further control terminal.

EXAMPLE 12

The switch device of any one of examples 10 or 11, wherein the control terminal and the further control terminal are gate terminals.

EXAMPLE 13

The switch device of any one of examples 1-12, wherein the first load terminal of the switch transistor is to be coupled to a first terminal of a load, the switch device further comprising a further switch transistor to be coupled to a second terminal of the load.

EXAMPLE 14

The switch device of any one of examples 1-13, wherein the monitoring component comprises at least one of a feedback path from the control terminal of the switch transistor, a capacitive coupling to a load path including the first and second load terminals of the switch transistor or a feedback for a potential of the switch transistor connected to a load.

EXAMPLE 15

The switch device of any one of examples 1-14, wherein the monitoring component is configured to monitor an effect of a signal at the control terminal independent of a load current or voltage at the load terminals.

EXAMPLE 16

A method, comprising:
applying a test control signal to a switch, the switch comprising a switch transistor including a control terminal and first and second load terminals, and
evaluating the test control signal in the switch independent from a load path comprising the first and second load terminals.

EXAMPLE 17

The method of example 16, wherein applying the test control signal comprises applying the test control signal while no load current is flowing via the first and second load terminals.

EXAMPLE 18

The method of example 17, further comprising deactivating a further switch transistor, the further switch transistor being coupled to a first terminal of a load and the switch transistor being coupled to a second terminal of the load, while applying the test control signal.

EXAMPLE 19

The method of example 17 or 18, wherein the switch transistor comprises a first control terminal and a second control terminal, wherein the method comprises applying the test control signal to the first control terminal while applying a further signal with an inactive signal level to the second control terminal.

EXAMPLE 20

The method of any one of examples 16-19, wherein the test control signal is applied as a short pulse as explained above.

EXAMPLE 21

A switch device, comprising:
a switch transistor,
a monitoring transistor,
wherein a control terminal of the monitoring transistor is coupled to a control terminal of the switch transistor,
wherein a first load terminal of the switch transistor is to be coupled to load,
wherein a first load terminal of the monitoring transistor is coupled to a monitor circuit, and
wherein a second load terminal of the switch transistor is coupled to a second terminal of the monitoring transistor.

The above described embodiments are not to be construed as limiting and serve only as examples.

What is claimed is:
1. A switch device, comprising:
a switch transistor including a control terminal, a first load terminal and a second load terminal, and
a monitoring component configured to monitor a signal at the control terminal of the switch transistor, wherein the monitoring component is configured to monitor an effect of a signal at the control terminal independent of a load current or voltage at the load terminals.
2. The switch device of claim 1, wherein the monitoring component and the switch transistor are provided on a same chip die.
3. The switch device of claim 1, wherein the monitoring component is configured to monitor the signal at a gate terminal essentially without influencing a load path including the first and second load terminals.
4. The switch device of claim 1, wherein the monitoring component is configured to monitor the signal at a gate terminal while no current flows between the first and second load terminals.
5. The switch device of claim 1, wherein the monitoring component comprises a further transistor, a control terminal of the further transistor being coupled to the control terminal of the switch transistor.
6. The switch device of claim 5, wherein the control terminal of the further transistor and the control terminal of the switch transistor are implemented in a common gate structure.
7. The switch device of claim 5, wherein the second load terminal of the switch transistor and a second load terminal of the further transistor are commonly coupled to one of a negative supply voltage or ground.

8. The switch device of claim 7, wherein the second load terminal of the switch transistor and the second load terminal of the further transistor are source terminals.

9. The switch device of claim 5, wherein a first load terminal of the further transistor is coupled to a feedback monitoring circuit configured to evaluate a signal received from the further transistor.

10. The switch device of claim 1, wherein the switch transistor comprises a further control terminal.

11. The switch device of claim 10, further comprising a further monitoring component associated with the further control terminal, the further monitoring component being configured to monitor a further signal applied to the further control terminal.

12. The switch device of claim 10, wherein the control terminal and the further control terminal are gate terminals.

13. The switch device of claim 1, wherein the first load terminal of the switch transistor is to be coupled to a first terminal of a load, the switch device further comprising a further switch transistor to be coupled to a second terminal of the load.

14. The switch device of claim 1, wherein the monitoring component comprises at least one of a feedback path from the control terminal of the switch transistor, a capacitive coupling to a load path including the first and second load terminals of the switch transistor or a feedback for a potential of the switch transistor connected to a load.

15. A method, comprising:
applying a test control signal to a switch device, the switch device comprising a switch transistor including a control terminal and first and second load terminals and a monitoring component, wherein the monitoring component is configured to monitor an effect of a signal at the control terminal independent of a load current or voltage at the load terminals, and
evaluating the test control signal in the switch independent from a load path comprising the first and second load terminals.

16. The method of claim 15, wherein applying the test control signal comprises applying the test control signal while no load current is flowing via the first and second load terminals.

17. The method of claim 16, further comprising deactivating a further switch transistor, the further switch transistor being coupled to a first terminal of a load and the switch transistor being coupled to a second terminal of the load, while applying the test control signal.

18. The method of claim 16, wherein the switch transistor comprises a first control terminal and a second control terminal, wherein the method comprises applying the test control signal to the first control terminal while applying a further signal with an inactive signal level to the second control terminal.

19. A switch device, comprising:
a switch transistor,
a monitoring transistor,
wherein a control terminal of the monitoring transistor is coupled to a control terminal of the switch transistor,
wherein a first load terminal of the switch transistor is to be coupled to a load,
wherein a first load terminal of the monitoring transistor is coupled to a monitor circuit, wherein the first load terminal of the monitoring transistor is different than the first load terminal of the switch transistor,
wherein a second load terminal of the switch transistor is coupled to a second load terminal of the monitoring transistor, and
wherein the monitoring transistor is configured to monitor a signal at the control terminal of the switch transistor independent of a load current or voltage at the load terminals.

* * * * *